United States Patent
Hao

(10) Patent No.: US 10,304,366 B2
(45) Date of Patent: May 28, 2019

(54) METHOD FOR OBTAINING LIQUID CRYSTAL DISPLAY CHARGING RATIO

(71) Applicant: Shenzhen China Star Optoelectronics Semiconductor Display Technology Co., Ltd., Shenzhen (CN)

(72) Inventor: Sikun Hao, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/742,045

(22) PCT Filed: Nov. 15, 2017

(86) PCT No.: PCT/CN2017/111048
§ 371 (c)(1),
(2) Date: Jan. 5, 2018

(87) PCT Pub. No.: WO2019/024323
PCT Pub. Date: Feb. 7, 2019

(65) Prior Publication Data
US 2019/0043395 A1    Feb. 7, 2019

(30) Foreign Application Priority Data
Aug. 3, 2017    (CN) .......................... 2017 1 0657607

(51) Int. Cl.
*G01R 19/10* (2006.01)
*G09G 3/00* (2006.01)
(52) U.S. Cl.
CPC ............. *G09G 3/006* (2013.01); *G01R 19/10* (2013.01); *G09G 2360/16* (2013.01)

(58) Field of Classification Search
CPC .............. G09G 3/006; G09G 2360/16; G09G 2360/0646
See application file for complete search history.

(56) References Cited

U.S. PATENT DOCUMENTS

| 2012/0147000 | A1* | 6/2012 | Song | H04N 13/341 345/419 |
|---|---|---|---|---|
| 2013/0135543 | A1* | 5/2013 | Kaifu | G02F 1/13306 349/33 |
| 2013/0293534 | A1* | 11/2013 | Sato | H04N 13/361 345/419 |

* cited by examiner

*Primary Examiner* — Jermele M Hollington
*Assistant Examiner* — Alvaro E Fortich
(74) *Attorney, Agent, or Firm* — Leong C. Lei

(57) ABSTRACT

The invention provides a method for obtaining LCD charging ratio, comprising: measuring V-T curve of LCD, voltage corresponding to peak (D1) of V-T curve being data signal voltage ($V_{data}$); lighting up heavy-duty and light-duty images of LCD according to same grayscale respectively, measuring actual display brightness of the heavy-duty and the light-duty images; computing a ratio between the actual display brightness of the heavy-duty and light-duty images; using the ratio between the actual display brightness of the heavy-duty and light-duty images as a ratio to find and mark a measure point (D2) on V-T curve forming the ratio with peak ($V_{pixel}$), voltage corresponding to measure point (D2) being peak value of pixel voltage; computing LCD charging ratio according to peak value ($V_{pixel}$) of pixel voltage and data signal voltage ($V_{data}$). As such, accuracy is high and applicable to verifying accuracy of results obtained by using conventional.

10 Claims, 7 Drawing Sheets

METHOD FOR OBTAINING LIQUID CRYSTAL DISPLAY CHARGING RATIO

BACKGROUND OF THE INVENTION

1. Field of the Invention

The present invention relates to the field of display techniques, and in particular to a method for obtaining liquid crystal display (LCD) charging ratio.

2. The Related Arts

The liquid crystal display (LCD), or LCD panel, provides the advantages of thinness, power-saving, no radiation, and so on, and is widely applied to, such as, liquid crystal TV, smart phone, digital camera, tablet PC, PC monitor, or notebook PC, and stays as a leading technology in panel display.

The operation principle behind the LCD is to pour liquid crystal (LC) molecules between the thin film transistor (TFT) array substrate and the color filter (CF) substrate, and then apply a driving voltage to the two substrates to control the rotation direction of the LC molecules to refract the light of the backlight module r to produce the image.

Refer to FIG. 1. The active area AA of the LCD has a plurality of pixels P arranged in an array, with each pixel further comprising a red sub-pixel R, a green sub-pixel G, and a blue sub-pixel B, arranged in the longitudinal direction. Each sub-pixel is electrically connected to a TFT T, the gate of the TFT T is connected to the scan line 100 extending in the lateral direction, the source is connected to the data line 200 extending in the longitudinal direction, and the drain is connected to the pixel electrode PX. Typically, a pixel P corresponds to a data line 200 and three scan lines 100, which is referred to as tri-gate architecture. Applying the gate scan signal Gate to the scan line 100 will cause all the TFTs T connected to the scan line 100 to turn on. Then, applying the data signal Data to the data line 200 will be able to write into corresponding sub-pixel to control the LC transmittance to achieve color and brightness control.

The charging ratio is an important index for LCD as the value directly affects the brightness, transmittance, display quality of the LCD. Refer to FIG. 2. The charging ratio is computed as:

$$C_{Ratio}=(V_{pixel}/V_{data})\times 100\%$$

Wherein $V_{data}$ is the voltage of the data signal Data when the gate scan signal Gate is in effect, and $V_{pixel}$ is the peak value of corresponding pixel voltage after charging sub-pixel.

In general, as shown in FIG. 2, the duration when the gate scan signal Gate is in effect is equal to the duration when the data signal Data is in effect. Without pre-charging, the LCD charging ration is relatively low. To increase charging ratio, as shown in FIG. 3, the duration when the gate scan signal Gate is in effect can be set longer than the duration when the data signal Data is in effect. As such, in pre-charging, the LCD charging ratio is increased.

The conventional process to obtain the LCD charging ratio comprises:
identifying pixel layout;
identifying the thickness and electric parameters, such as, conductivity, dielectric constant, and so on, of each film layer forming the pixel;
extracting related electric parameters of resistors, capacitors;
establishing a model card of the TFT based on the TFT characteristics inside the sub-pixel;
establishing a SPICE model based on the LCD driving method;
obtaining pixel voltage by analogy, and computing charging ratio.

The aforementioned conventional method has obvious shortcoming: the charging ratio only has simulation result, the accuracy cannot be ensured, and cannot be verified through experiment.

SUMMARY OF THE INVENTION

The object of the present invention is to provide a method for obtaining LCD charging ratio, with higher accuracy, applicable to verifying accuracy of the results obtained by using the conventional method for obtaining LCD charging ratio.

To achieve the above object, the present invention provides a method for obtaining LCD charging ratio, which comprises:

Step S1: providing an LCD;

Step S2: measuring V-T curve of the LCD, a voltage corresponding to a peak of the V-T curve being a data signal voltage;

Step S3: lighting up heavy-duty image and light-duty image of the LCD according to a same grayscale respectively, measuring and recording actual display brightness of the heavy-duty image and the light-duty image;

Step S4: computing a ratio between the actual display brightness of the heavy-duty image and the actual display brightness of the light-duty image;

Step S5: using the ratio between the actual display brightness of the heavy-duty image and the actual display brightness of the light-duty image as a ratio to find and mark a measure point on the V-T curve forming the ratio with the peak, voltage corresponding to the measure point being peak value of pixel voltage;

Step S6: computing the LCD charging ratio according to the peak value of pixel voltage and data signal voltage;

$$C_{Ratio}=(V_{pixel}/V_{data})\times 100\%$$

Wherein $C_{Ratio}$ being LCD charging ratio, $V_{data}$ being the voltage of the data signal, and $V_{pixel}$ being the peak value of pixel voltage.

According to a preferred embodiment of the present invention, the light-duty image is a white image.

According to a preferred embodiment of the present invention, the heavy-duty image comprises a single-color red image, a single-color green image, and a single-color blue image.

According to a preferred embodiment of the present invention, in Step S3, the lighting up the light-duty image is achieved by lighting up the single-color red image, the single-color green image, and the single-color blue image sequentially.

According to a preferred embodiment of the present invention, in Step S4, computing a ratio between the actual display brightness of the heavy-duty image and the actual display brightness of the light-duty image uses the following equation:

$$Lv_{Ratio}=(Lv_R+Lv_G+Lv_B)/Lv_W$$

wherein $Lv_{Ratio}$ is the ratio between the actual display brightness of the heavy-duty image and the actual display brightness of the light-duty image, $Lv_R$ is the actual display brightness of the single-color red image, $Lv_G$ is the actual display brightness of the single-color green image, $Lv_B$ is the actual display brightness of the single-color blue image, and $Lv_W$ is the actual display brightness of the white image.

According to a preferred embodiment of the present invention, the same grayscale used in Step S3 is grayscale 255.

According to a preferred embodiment of the present invention, the white image, the single-color red image, the single-color green image, and the single-color blue image are all stored in pre-charging process.

The present invention also provides a method for obtaining LCD charging ratio, which comprises:

Step S1: providing an LCD;

Step S2: measuring V-T curve of the LCD, a voltage corresponding to a peak of the V-T curve being a data signal voltage;

Step S3: lighting up heavy-duty image and light-duty image of the LCD according to a same grayscale respectively, measuring and recording actual display brightness of the heavy-duty image and the light-duty image;

Step S4: computing a ratio between the actual display brightness of the heavy-duty image and the actual display brightness of the light-duty image;

Step S5: using the ratio between the actual display brightness of the heavy-duty image and the actual display brightness of the light-duty image as a ratio to find and mark a measure point on the V-T curve forming the ratio with the peak, voltage corresponding to the measure point being peak value of pixel voltage;

Step S6: computing the LCD charging ratio according to the peak value of pixel voltage and data signal voltage;

$$C_{Ratio}=(V_{pixel}/V_{data})\times 100\%$$

wherein $C_{Ratio}$ being LCD charging ratio, $V_{data}$ being the voltage of the data signal, and $V_{pixel}$ being the peak value of pixel voltage;

wherein the light-duty image being a white image;

wherein the heavy-duty image comprising a single-color red image, a single-color green image, and a single-color blue image;

wherein in Step S3, the lighting up the light-duty image being achieved by lighting up the single-color red image, the single-color green image, and the single-color blue image sequentially;

wherein the white image, the single-color red image, the single-color green image, and the single-color blue image being all stored in pre-charging process.

The present invention provides the following advantages: the invention provides a method for obtaining LCD charging ratio, comprising: measuring V-T curve of the LCD, a voltage corresponding to a peak of the V-T curve being a data signal voltage; lighting up heavy-duty image and light-duty image of the LCD according to a same grayscale respectively, measuring and recording actual display brightness of the heavy-duty image and the light-duty image; computing a ratio between the actual display brightness of the heavy-duty image and the actual display brightness of the light-duty image; using the ratio between the actual display brightness of the heavy-duty image and the actual display brightness of the light-duty image as a ratio to find and mark a measure point on the V-T curve forming the ratio with the peak, voltage corresponding to the measure point being peak value of pixel voltage; computing the LCD charging ratio according to the peak value of pixel voltage and data signal voltage. As such, the accuracy is high and applicable to verifying accuracy of the results obtained by using the conventional method for obtaining LCD charging ratio.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 4:
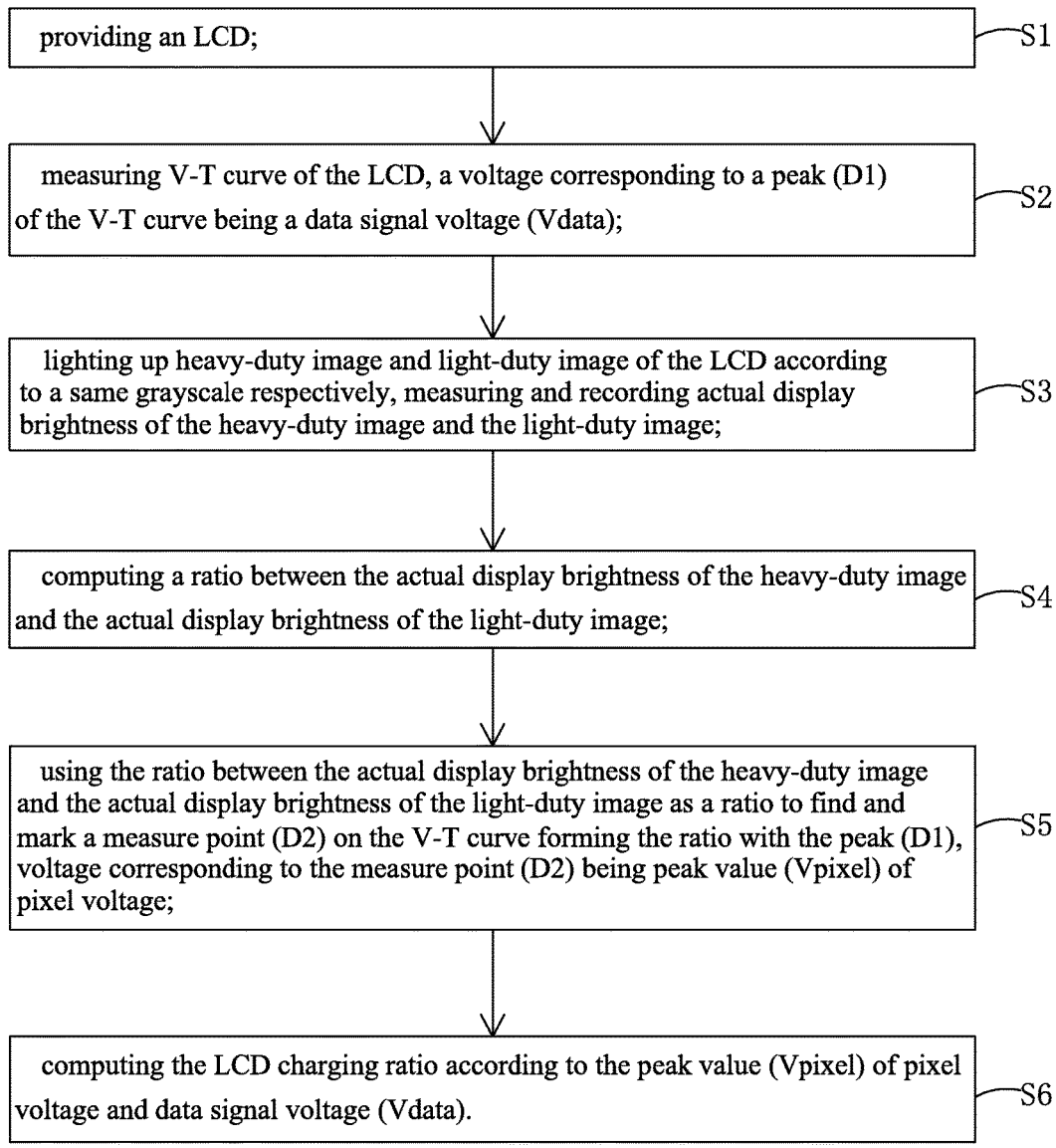
FIG. 4 is a schematic view showing the flowchart of a preferred embodiment of the method for obtaining LCD charging ratio of the present invention.

Referring to FIG. 4, FIG. 4 is a schematic view showing the flowchart of a preferred embodiment of the method for obtaining LCD charging ratio of the present invention. The method comprises:

Step S1: providing an LCD.

Figure 1:
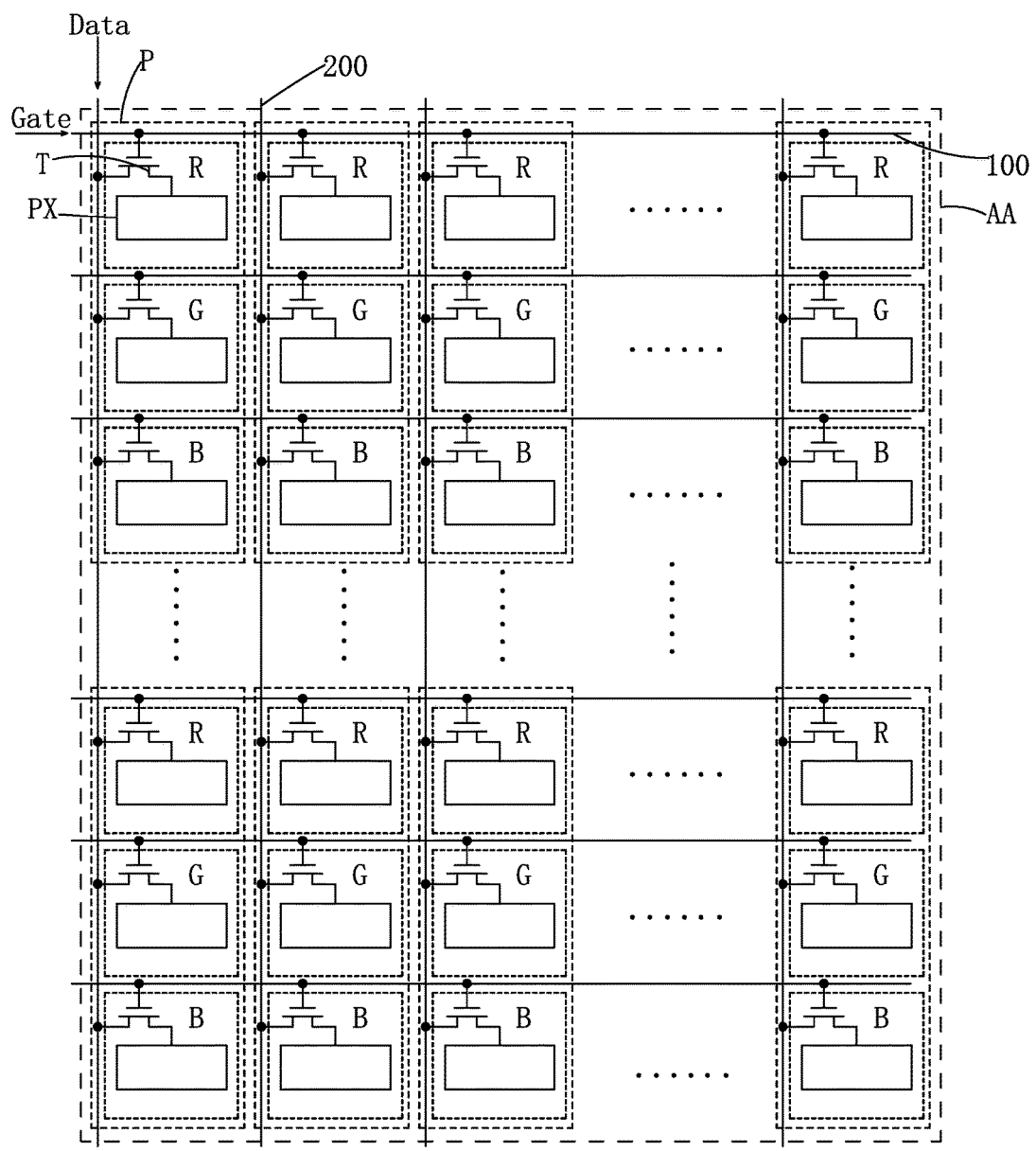
FIG. 1 is a schematic view showing a known tri-gate architecture LCD with active areas.
Figure 2:
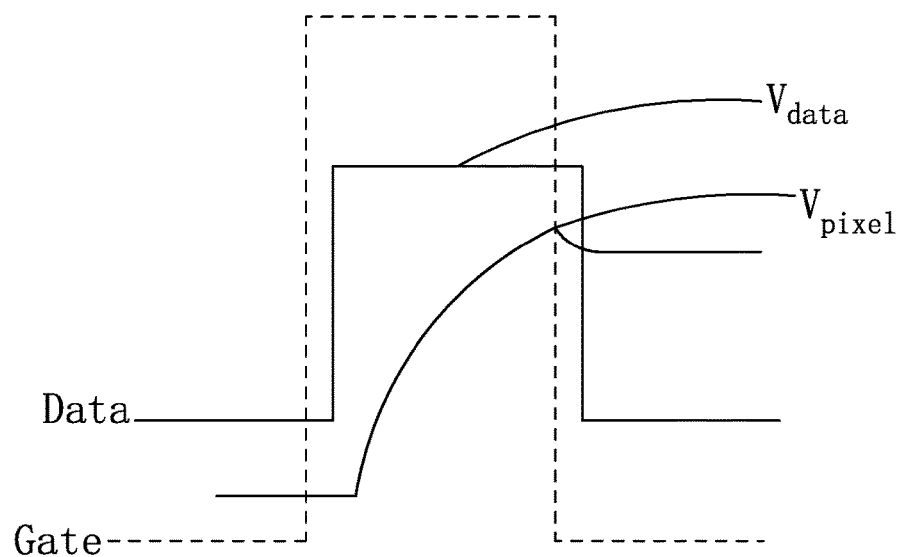
FIG. 2 is a schematic view showing the timing sequence without pre-charging process for the LCD of FIG. 1.
Figure 3:
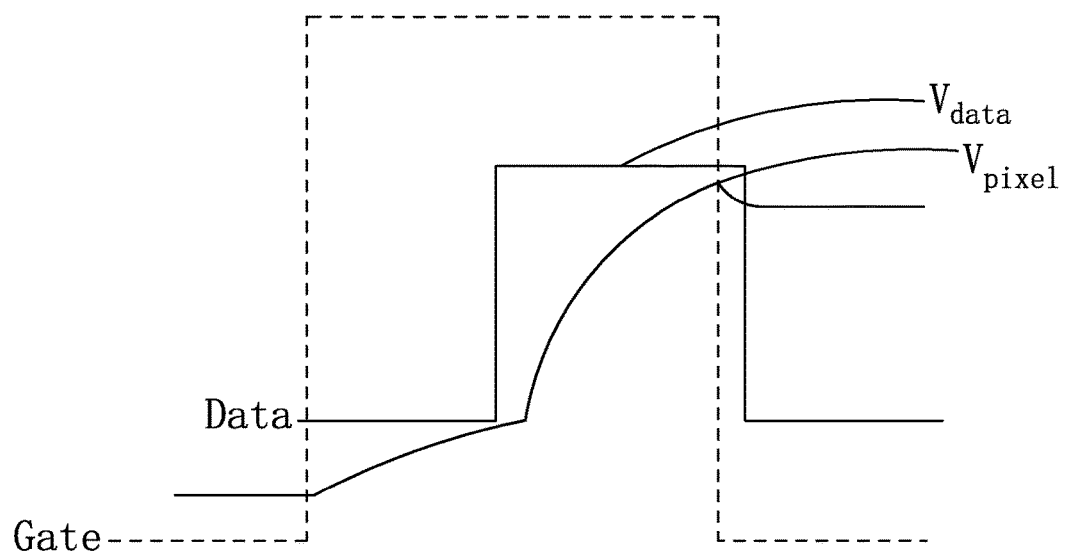
FIG. 3 is a schematic view showing the timing sequence with pre-charging process for the LCD of FIG. 1.

The LCD is a tri-gate architecture LCD as shown in FIG. 1, wherein the active area is disposed with a plurality of pixels P arranged in an array, with each pixel further comprising a red sub-pixel R, a green sub-pixel G, and a blue sub-pixel B, arranged in the longitudinal direction. Each sub-pixel is electrically connected to a TFT T, the gate of the TFT T is connected to the scan line 100 extending in the lateral direction, the source is connected to the data line 200 extending in the longitudinal direction, and the drain is connected to the pixel electrode PX. Typically, a pixel P corresponds to a data line 200 and three scan lines 100. Applying the gate scan signal Gate to the scan line 100 will cause all the TFTs T connected to the scan line 100 to turn on. Then, applying the data signal Data to the data line 200 will be able to write into corresponding sub-pixel to control the LC transmittance to achieve color and brightness control.

Figure 5:
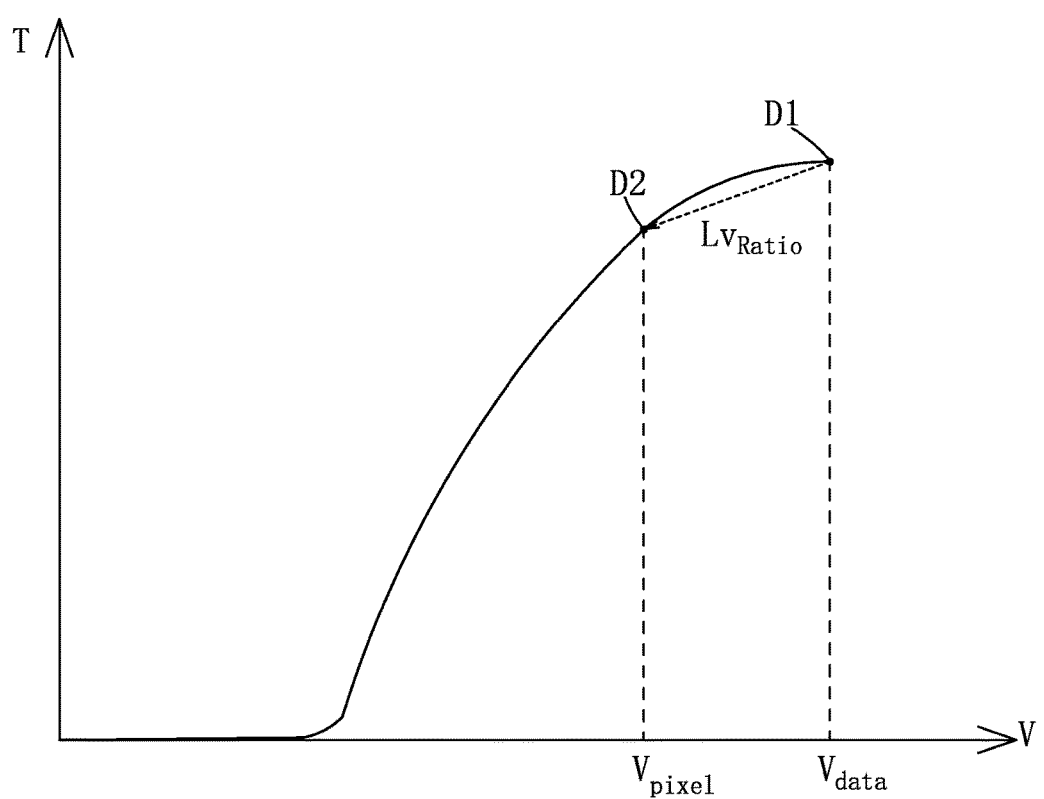
FIG. 5 is a schematic view showing the V-T curve used in a preferred embodiment of the method for obtaining LCD charging ratio of the present invention.

Step S2: as shown in FIG. 5, measuring V-T curve of the LCD (V is the voltage and T is the transmittance ratio).

The voltage corresponding to a peak D1 of the V-T curve is a data signal voltage $V_{data}$.

Figure 6:
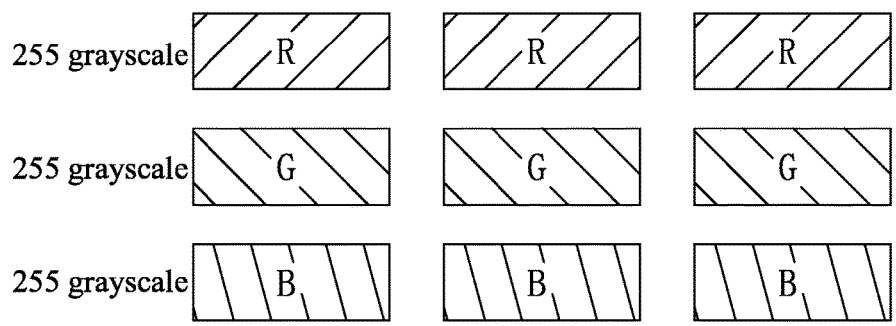
FIG. 6 is a schematic view showing lighting up a white image in a preferred embodiment of the method for obtaining LCD charging ratio of the present invention.
Figure 8:
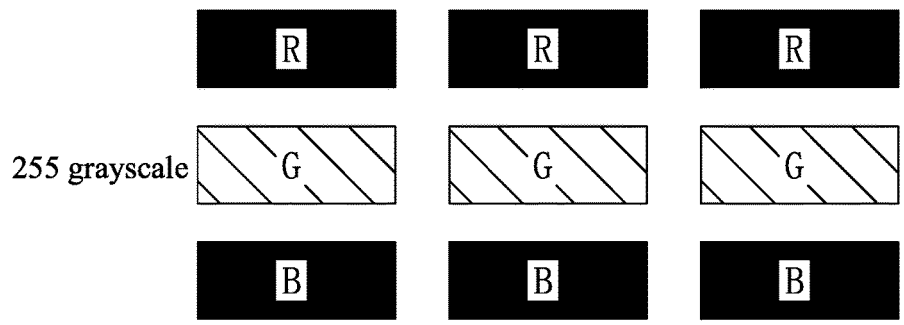
FIG. 8 is a schematic view showing lighting up a single-color green image in a preferred embodiment of the method for obtaining LCD charging ratio of the present invention.

Step S3: as shown in FIG. 6 and FIG. 8, lighting up heavy-duty image and light-duty image of the LCD according to a same grayscale respectively, measuring and recording actual display brightness of the heavy-duty image and the light-duty image.

Specifically, the same grayscale used is preferably grayscale 255.

Figure 7:
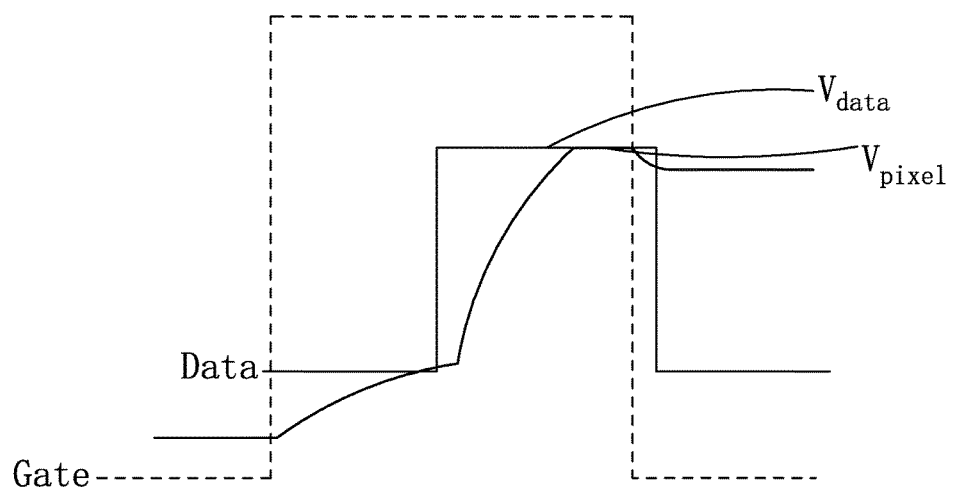
FIG. 7 is a schematic view showing the timing sequence corresponding to FIG. 6.

The light-duty image is a white image; that is, the red sub-pixel R, the green sub-pixel G and the blue sub-pixel B are all lighted up at grayscale 255. Refer to FIG. 6 and FIG. 7. The light-duty image for lighting up the LCD is stored in the pre-charging process, and the pre-charging voltage is higher. The final peak value $V_{pixel}$ of pixel voltage can reach the data signal $V_{data}$.

Figure 9:
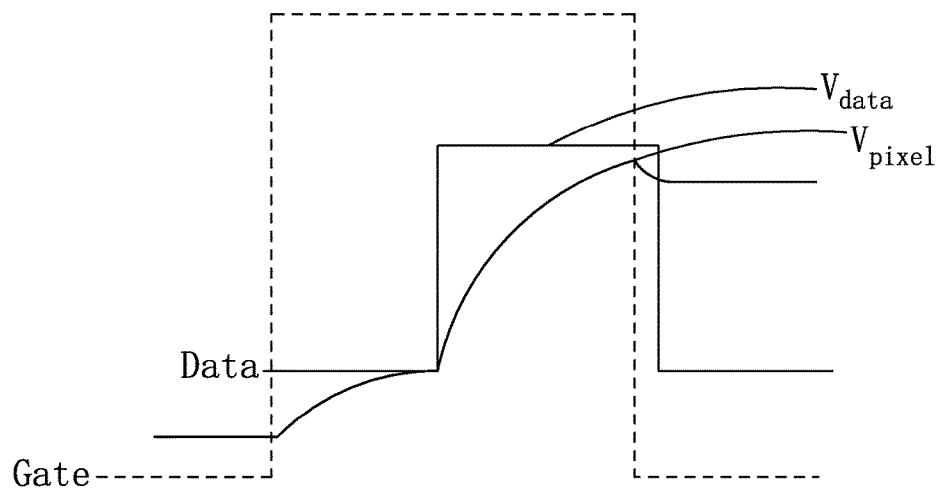
FIG. 9 is a schematic view showing the timing sequence corresponding to FIG. 8.

The heavy-duty image comprises a single-color red image, a single-color green image, and a single-color blue image. In Step S3, the lighting up the light-duty image is achieved by lighting up the single-color red image, i.e., lighting up red sub-pixel R at grayscale 255, the single-color green image i.e., lighting up green sub-pixel G at grayscale 255, and the single-color blue imag, i.e., lighting up blue sub-pixel B at grayscale 255, sequentially. Refer to FIG. 8 and FIG. 9. The heavy-duty image (take the single-color green image as example) for lighting up the LCD is stored in the pre-charging process, and the pre-charging voltage is lower. The final peak value $V_{pixel}$ of pixel voltage is lower than the data signal $V_{data}$.

Step S4: computing a ratio between the actual display brightness of the heavy-duty image and the actual display brightness of the light-duty image.

Specifically, in Step S4, computing a ratio between the actual display brightness of the heavy-duty image and the actual display brightness of the light-duty image uses the following equation:

$$Lv_{Ratio}=(Lv_R+Lv_G+Lv_B)/Lv_W$$

wherein $Lv_{Ratio}$ is the ratio between the actual display brightness of the heavy-duty image and the actual display brightness of the light-duty image, $Lv_R$ is the actual display brightness of the single-color red image, $Lv_G$ is the actual display brightness of the single-color green image, $Lv_B$ is the actual display brightness of the single-color blue image, and $Lv_W$ is the actual display brightness of the white image.

Step S5: as shown in FIG. 5, using the ratio between the actual display brightness of the heavy-duty image and the actual display brightness of the light-duty image as a ratio to find and mark a measure point D2 on the V-T curve forming the ratio with the peak D1, voltage corresponding to the measure point D2 being peak value of pixel voltage $V_{pixel}$.

Step S6: computing the LCD charging ratio according to the peak value of pixel voltage and data signal voltage;

$$C_{Ratio}=(V_{pixel}/V_{data})\times 100\%$$

Wherein $C_{Ratio}$ being LCD charging ratio, $V_{data}$ being the voltage of the data signal, and $V_{pixel}$ being the peak value of pixel voltage.

Figure 10:
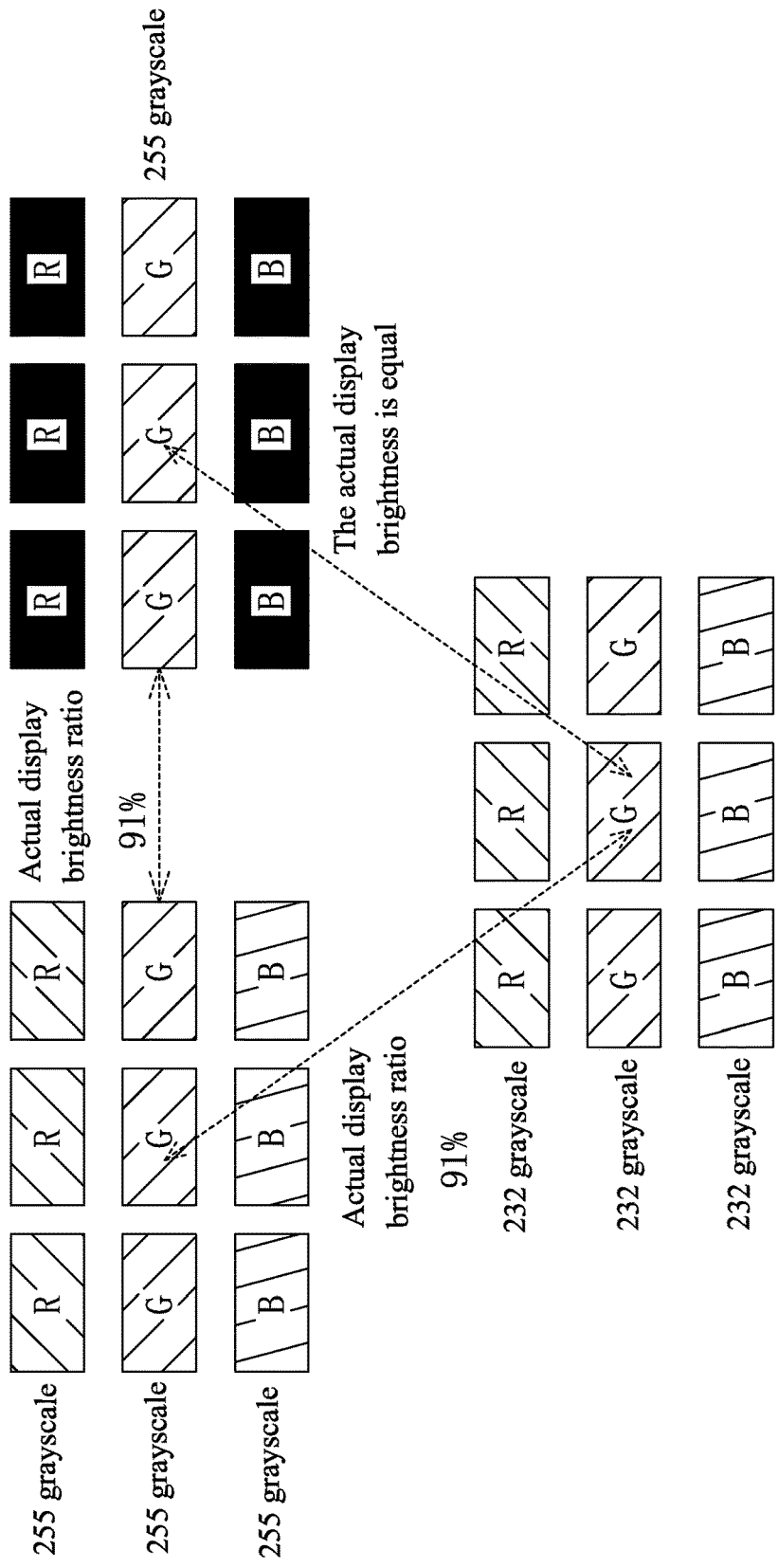
FIG. 10 is a schematic view showing the principle of method for obtaining LCD charging ratio of the present invention.

Refer to FIG. 10, in combination with FIG. 5. The principle of the method for obtaining the LCD charging ratio is as follows:

Because the heavy-duty image (e.g., the single-color green image) is insufficiently charged, the actual display brightness at 255 grayscale is less than the actual display brightness of the white image at 255 grayscale. For example, the actual display brightness of the single-color green image at 255 grayscale is only 91% of the actual display brightness of the white image at 255 grayscale; that is, the actual display brightness of the single-color green image at 255 grayscale is equal to the actual display brightness of the white image at 232 grayscale. The brightness equality correspondingly means equal peak value $V_{pixel}$ of pixel voltage, and the brightness corresponds to transmittance ratio. As such, using the ratio between the actual display brightness of the heavy-duty image and the actual display brightness of the light-duty image as a ratio to find and mark a measure point D2 on the V-T curve forming the ratio with the peak D1, voltage corresponding to the measure point D2 is peak value of pixel voltage $V_{pixel}$. Then, by computing the ratio between the peak value $V_{pixel}$ of pixel voltage and data signal voltage $V_{data}$, the LCD charging ratio $C_{Ratio}$ is obtained. This method obtains LCD charging ratio through actual measurement so that the accuracy is higher and applicable to verifying accuracy of the results obtained by using the conventional method for obtaining LCD charging ratio.

In summary, the invention provides a method for obtaining LCD charging ratio, comprising: measuring V-T curve of the LCD, a voltage corresponding to a peak of the V-T curve being a data signal voltage; lighting up heavy-duty image and light-duty image of the LCD according to a same grayscale respectively, measuring and recording actual display brightness of the heavy-duty image and the light-duty image; computing a ratio between the actual display brightness of the heavy-duty image and the actual display brightness of the light-duty image; using the ratio between the actual display brightness of the heavy-duty image and the actual display brightness of the light-duty image as a ratio to find and mark a measure point on the V-T curve forming the ratio with the peak, voltage corresponding to the measure point being peak value of pixel voltage; computing the LCD charging ratio according to the peak value of pixel voltage and data signal voltage. As such, the accuracy is high and applicable to verifying accuracy of the results obtained by using the conventional method for obtaining LCD charging ratio.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method for obtaining liquid crystal display (LCD) charging ratio, which comprises:

Step S1: providing an LCD;

Step S2: measuring voltage-transmittance (V-T) curve of the LCD, a voltage corresponding to a peak of the V-T curve being a data signal voltage;

Step S3: lighting up heavy-duty image and light-duty image of the LCD according to a same grayscale respectively, measuring and recording actual display brightness of the heavy-duty image and the light-duty image;

Step S4: computing a ratio between the actual display brightness of the heavy-duty image and the actual display brightness of the light-duty image;

Step S5: using the ratio between the actual display brightness of the heavy-duty image and the actual display brightness of the light-duty image as a ratio to find and mark a measure point on the V-T curve forming the ratio with the peak, voltage corresponding to the measure point being peak value of pixel voltage;

Step S6: computing the LCD charging ratio according to the peak value of pixel voltage and data signal voltage;

$$CRatio = (Vpixel/Vdata) \times 100\%;$$

wherein CRatio being LCD charging ratio, Vdata being the voltage of the data signal, and Vpixel being the peak value of pixel voltage.

2. The method for obtaining LCD charging ratio as claimed in claim 1, wherein the light-duty image is a white image.

3. The method for obtaining LCD charging ratio as claimed in claim 2, wherein the heavy-duty image comprises a single-color red image, a single-color green image, and a single-color blue image.

4. The method for obtaining LCD charging ratio as claimed in claim 3, wherein in Step S3, the lighting up the light-duty image is achieved by lighting up the single-color red image, the single-color green image, and the single-color blue image sequentially.

5. The method for obtaining LCD charging ratio as claimed in claim 4, wherein in Step S4, computing a ratio between the actual display brightness of the heavy-duty image and the actual display brightness of the light-duty image uses the following equation:

$$Lv_{Ratio} = (Lv_R + Lv_G + Lv_B)/Lv_W;$$

wherein $Lv_{Ratio}$ is the atio between the actual display brightness of the heavy-duty image and the actual display brightness of the light-duty image, $Lv_R$ is the actual display brightness of the single-color red image, $Lv_G$ is the actual display brightness of the single-color green image, $Lv_B$ is the actual display brightness of the single-color blue image, and $Lv_W$ is the actual display brightness of the white image.

6. The method for obtaining LCD charging ratio as claimed in claim 4, wherein the same grayscale used in Step S3 is grayscale 255.

7. The method for obtaining LCD charging ratio as claimed in claim 3, wherein the white image, the single-color red image, the single-color green image, and the single-color blue image are all stored in pre-charging process.

8. A method for obtaining liquid crystal display (LCD) charging ratio, which comprises:

Step S1: providing an LCD;

Step S2: measuring voltage-transmittance (V-T) curve of the LCD, a voltage corresponding to a peak of the V-T curve being a data signal voltage;

Step S3: lighting up heavy-duty image and light-duty image of the LCD according to a same grayscale respectively, measuring and recording actual display brightness of the heavy-duty image and the light-duty image;

Step S4: computing a ratio between the actual display brightness of the heavy-duty image and the actual display brightness of the light-duty image;

Step S5: using the ratio between the actual display brightness of the heavy-duty image and the actual display brightness of the light-duty image as a ratio to find and mark a measure point on the V-T curve forming the ratio with the peak, voltage corresponding to the measure point being peak value of pixel voltage;

Step S6: computing the LCD charging ratio according to the peak value of pixel voltage and data signal voltage;

$$CRatio = (Vpixel/Vdata) \times 100\%;$$

wherein CRatio being LCD charging ratio, Vdata being the voltage of the data signal, and Vpixel being the peak value of pixel voltage;

wherein the light-duty image being a white image;

the heavy-duty image comprising a single-color red image, a single-color green image, and a single-color blue image;

in Step S3, the lighting up the light-duty image being achieved by lighting up the single-color red image, the single-color green image, and the single-color blue image sequentially;

wherein the white image, the single-color red image, the single-color green image, and the single-color blue image being all stored in pre-charging process.

9. The method for obtaining LCD charging ratio as claimed in claim 8, wherein in Step S4, computing a ratio between the actual display brightness of the heavy-duty image and the actual display brightness of the light-duty image uses the following equation:

$$Lv_{Ratio} = (Lv_R + Lv_G + Lv_B)/Lv_W;$$

wherein $Lv_{Ratio}$ is the atio between the actual display brightness of the heavy-duty image and the actual display brightness of the light-duty image, $Lv_R$ is the actual display brightness of the single-color red image, $Lv_G$ is the actual display brightness of the single-color green image, $Lv_B$ is the actual display brightness of the single-color blue image, and $Lv_W$ is the actual display brightness of the white image.

10. The method for obtaining LCD charging ratio as claimed in claim 8, wherein the same grayscale used in Step S3 is grayscale 255.

* * * * *